US010910019B2

(12) United States Patent
Niss et al.

(10) Patent No.: US 10,910,019 B2
(45) Date of Patent: *Feb. 2, 2021

(54) RETRACTABLE GUIDE FEATURES FOR DATA STORAGE DEVICE CARRIERS

(71) Applicant: Western Digital Technologies, Inc., San Jose, CA (US)

(72) Inventors: David William Niss, Boulder, CO (US); Jeffrey David Wilke, Palmer Lake, CO (US)

(73) Assignee: Western Digital Technologies, Inc., San Jose, CA (US)

( * ) Notice: Subject to any disclaimer, the term of this patent is extended or adjusted under 35 U.S.C. 154(b) by 177 days.

This patent is subject to a terminal disclaimer.

(21) Appl. No.: 15/869,897

(22) Filed: Jan. 12, 2018

(65) Prior Publication Data

US 2019/0019537 A1  Jan. 17, 2019

Related U.S. Application Data

(63) Continuation of application No. 14/604,229, filed on Jan. 23, 2015, now Pat. No. 9,870,804.

(51) Int. Cl.
| | |
|---|---|
| *H05K 5/00* | (2006.01) |
| *H05K 7/00* | (2006.01) |
| *G06F 1/18* | (2006.01) |
| *G11B 33/12* | (2006.01) |
| *H05K 7/14* | (2006.01) |
| *H05K 7/18* | (2006.01) |

(52) U.S. Cl.
CPC .......... *G11B 33/128* (2013.01); *G11B 33/124* (2013.01); *G06F 1/187* (2013.01); *H05K 7/1421* (2013.01); *H05K 7/18* (2013.01)

(58) Field of Classification Search
CPC ..... G11B 33/128; G11B 33/124; G06F 1/181; G06F 1/187; H05K 7/1409; H05K 7/1421; H05K 7/1487; H05K 7/18
See application file for complete search history.

(56) References Cited

U.S. PATENT DOCUMENTS

| | | |
|---|---|---|
| 2,272,807 A | 2/1942 | Kronheim |
| 4,841,100 A | 6/1989 | Ignasiak |
| (Continued) | | |

OTHER PUBLICATIONS

"Compaq Hot Plug Drive Carrier Enhancements." Compaq Computer Corporation. First Edition, Document No. 0225-0699-A. (1999).

(Continued)

*Primary Examiner* — Tan Le

(57) ABSTRACT

Data storage device mounting systems to provide alignment and mounting of data storage devices are provided herein. A carrier is configured to couple to a data storage device and hang the data storage device in a vertical orientation in a data storage assembly from retractable mounting pins coupled to the carrier. The carrier also includes retractable alignment features to guide the data storage device and carrier into the mounting system. Finger grips are coupled to retractable alignment features and mounting pins and configured to extend retractable alignment features beyond the carrier concurrent with retracting the mounting pins when actuated by a user squeezing the finger grips. The finger grips are configured to extend the mounting pins when de-actuated by the user.

20 Claims, 8 Drawing Sheets

(56) References Cited

U.S. PATENT DOCUMENTS

| | | | |
|---|---|---|---|
| 5,761,031 A | 6/1998 | Ajmani | |
| 5,995,365 A | 11/1999 | Broder et al. | |
| 6,233,143 B1 | 5/2001 | Gamble et al. | |
| 6,249,432 B1 | 6/2001 | Gamble et al. | |
| 6,270,174 B1 | 8/2001 | Nishi | |
| 6,501,644 B1 | 12/2002 | Silverman et al. | |
| 6,592,387 B2 | 7/2003 | Komenda et al. | |
| 6,695,520 B1 | 2/2004 | Sarno et al. | |
| 6,987,674 B2 | 1/2006 | El-Batal et al. | |
| 7,515,407 B2 | 4/2009 | Goodman et al. | |
| 7,679,896 B2* | 3/2010 | Deng | G06F 1/187 312/223.1 |
| 7,944,691 B1 | 5/2011 | Pounds | |
| 8,077,578 B2 | 12/2011 | Tsuchida | |
| 8,248,775 B2 | 8/2012 | Zhang et al. | |
| 8,310,827 B2* | 11/2012 | Huang | G06F 1/187 312/223.2 |
| 8,325,474 B2 | 12/2012 | Spaulding et al. | |
| 8,931,748 B2 | 1/2015 | Bowman et al. | |
| 9,253,914 B2 | 2/2016 | Demange | |
| 9,361,946 B2* | 6/2016 | Bell | G11B 33/128 |
| 9,870,804 B2* | 1/2018 | Niss | G11B 33/124 |
| 2005/0072745 A1 | 4/2005 | Schmidk et al. | |
| 2005/0088778 A1 | 4/2005 | Chen et al. | |
| 2007/0153040 A1 | 7/2007 | Park et al. | |
| 2008/0104280 A1 | 5/2008 | Biskeborn | |
| 2010/0020438 A1 | 1/2010 | Gross et al. | |
| 2011/0109990 A1 | 5/2011 | Fang et al. | |
| 2012/0182671 A1* | 7/2012 | Hou | H05K 7/1489 361/679.01 |
| 2012/0327595 A1 | 12/2012 | Caldwell et al. | |
| 2013/0199295 A1 | 8/2013 | Hoefer et al. | |
| 2014/0016262 A1* | 1/2014 | Lo | G06F 1/187 361/679.33 |
| 2015/0316964 A1 | 11/2015 | Albert et al. | |
| 2019/0156865 A1* | 5/2019 | Wilke | G06F 1/187 |

OTHER PUBLICATIONS

"Data Storage Rotational Vibration Solution." Aearo Technologies. (2013).

U.S. Appl. No. 14/218,117, filed Mar. 18, 2014.

U.S. Appl. No. 14/316,781, filed Jun. 26, 2014.

* cited by examiner

RETRACTABLE GUIDE FEATURES FOR DATA STORAGE DEVICE CARRIERS

RELATED APPLICATIONS

This application is a continuation of U.S. patent application Ser. No. 14/604,229, entitled "RETRACTABLE GUIDE FEATURES FOR DATA STORAGE DEVICE CARRIERS," and filed Jan. 23, 2015, now U.S. Pat. No. 9,870,804, which is hereby incorporated by reference in its entirety.

TECHNICAL BACKGROUND

Computer and network systems such as personal computers, workstations, server systems, and cloud storage systems, typically include data storage systems for storing and retrieving data. These data storage systems can include data storage devices, such as hard disk drives, solid state storage devices, tape storage devices, and other mass storage devices.

One approach to providing sufficient data storage is the use of arrays of independent data storage devices. A number of data storage devices can be held in a container, sometimes referred to as a sled. A sled is a modular unit that can hold and operate a number of independent data storage devices in an array. The data storage devices are held and operated in close proximity within the sled, so that many data storage devices can be fit into a defined volume. Installing data storage devices into sleds becomes increasingly difficult as the density of data storage devices within the sled increases. A sled can hold tens of data storage devices within an enclosure, with the enclosure including an external connector that is electrically coupled to all of the included data storage devices.

The enclosure can also include fans or other cooling devices. Rackmount enclosures can be used to hold very large amounts of data. Rackmount enclosures typically hold multiple sleds. The sleds aid in installing or removing the data storage devices from the rackmount enclosure. Consequently, storage capacity can be increased in large increments by the installation of an additional sled, sleds, or rackmount enclosures containing multiple data storage devices.

Overview

Data storage device mounting systems to provide alignment and mounting of data storage devices are provided herein. A carrier is configured to couple to a data storage device and hang the data storage device in a vertical orientation in a data storage assembly from retractable mounting pins coupled to the carrier. The carrier also includes retractable alignment features to guide the data storage device and carrier into the mounting system. Finger grips are coupled to retractable alignment features and mounting pins and configured to extend retractable alignment features beyond the carrier concurrent with retracting the mounting pins when actuated by a user squeezing the finger grips. The finger grips are configured to extend the mounting pins concurrently with retracting the retractable alignment features when de-actuated by the user.

Additionally, data storage assemblies for holding an array of data storage drives are provided herein. The data storage assemblies include a plurality of carriers configured to couple to associated data storage drives, each of the plurality of carriers comprising retractable alignment projections that extend during insertion of the associated data storage drives into the data storage assembly and retractable hanging pins that retract during insertion of the associated data storage drives into the data storage assembly. The retractable alignment projections are configured to prevent insertion of the associated data storage drives into the data storage assembly beyond a predetermined depth and align electrical connectors of the associated data storage drives with electrical connectors of the data storage assembly. The data storage assemblies for holding an array of data storage drives include a plurality of drive dividers comprising alignment guides configured to assist alignment of the plurality of carriers upon insertion into the data storage assembly. The plurality of drive dividers are configured to interface with the retractable hanging pins to support the data storage devices from an associated one or the plurality of carriers.

DETAILED DESCRIPTION

Figure 1:
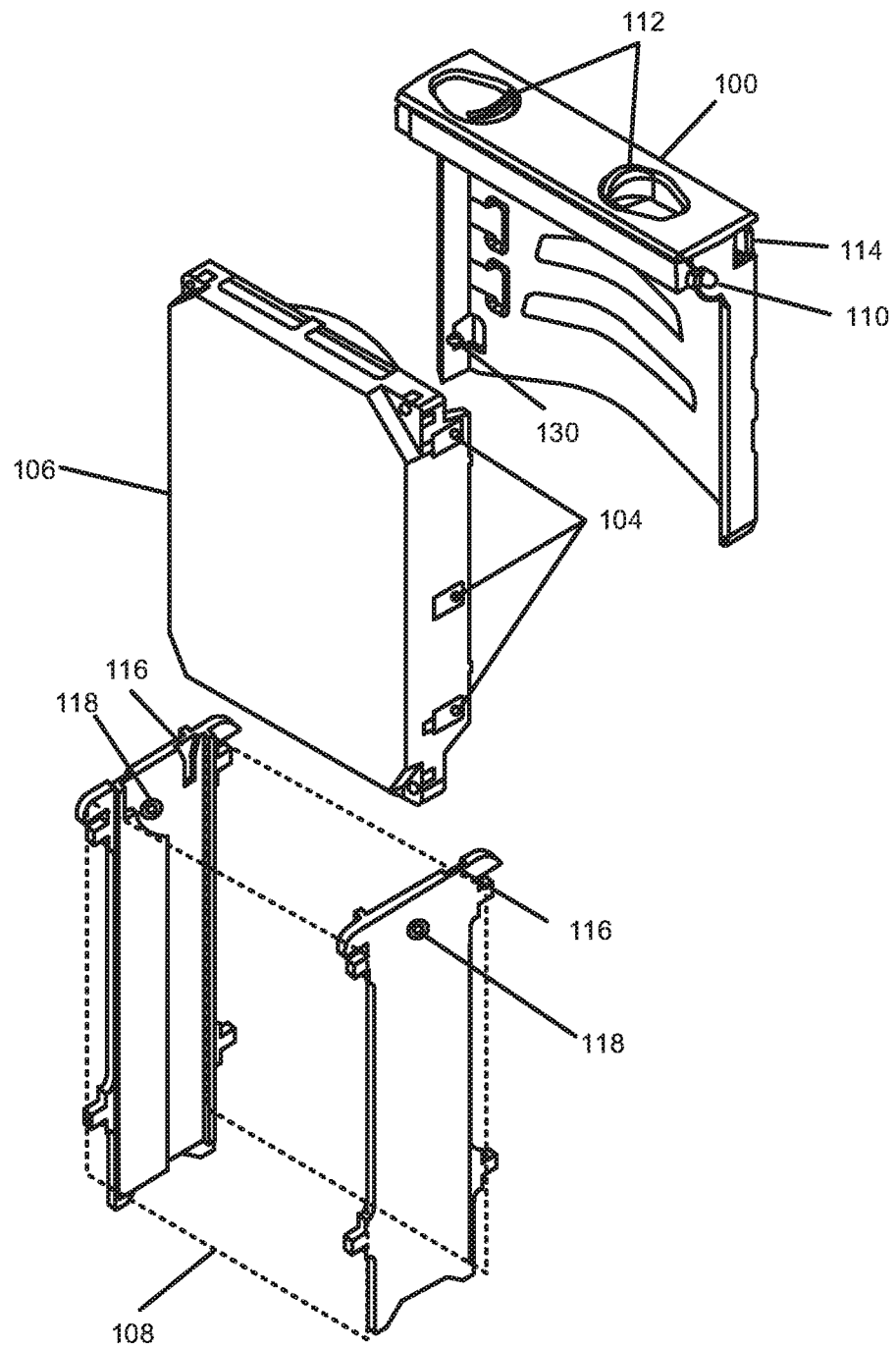
FIG. 1 illustrates a data storage device carrier for installing and mounting a data storage device into a data storage assembly.

FIG. 1 illustrates data storage device carrier 100 for installing and mounting data storage device 106 into data storage assembly 108. The size, shape and general configuration of data storage device carrier 100 is configurable to adapt to external mounting features 104 or external surface features of data storage device 106 to accommodate different makes and models of data storage devices.

Data storage device carrier 100 comprises mounting pins 110, finger grips 112, retractable alignment features 114 and device mating features 130. Data storage device carrier 100 couples to external mounting features 104 of data storage device 106 and supports data storage device 106 in a vertical orientation in data storage assembly 108 from mounting pins 110.

Mounting pins 110 are configured to engage hanging features 118 of data storage assembly 108 to support data storage device 106 in a vertical orientation in data storage assembly 108. Mounting pins 110 are coupled to finger grips 112. Mounting pins 110 are extended when finger grips 112 are not actuated. Mounting pins 110 retract when finger grips 112 are actuated. In this particular example, mounting pins 110 have a circular cross-section and the corresponding hanging features 118 are configured to engage mounting pins 110 having a circular cross-section. However, different cross-sectional shapes such as squares, rectangles, triangles or other cross-sectional geometries will can be used as mounting pins 110 to support data storage device 106 in a vertical orientation within data storage assembly 108

Finger grips 112 are coupled to mounting pins 110 and retractable alignment features 114 and configured to protrude retractable alignment features 114 concurrent with retracting mounting pins 110 when actuated to provide at least alignment during insertion of data storage device 106 into data storage assembly 108. Alternatively, finger grips 112 are configured to extend mounting pins 110 concurrent with retracting retractable alignment features 114 when de-actuated by the user. The size and shape of finger grips 112 can vary along with the data storage device carrier 100 to accommodate a variety of data storage devices 106.

Retractable alignment features 114 are configured to engage alignment guides 116 to provide alignment of data storage device 106 during insertion of data storage device 106 into data storage assembly 108. The size and shape of retractable alignment features 114 and associated alignment guides 116 can vary along with data storage device carrier 100 to accommodate different makes, models and brands of data storage devices. In this particular example, retractable alignment features 114 have a rectangular cross-section. However, the cross-section of retractable alignment features 114 can be square, circular, triangular or some other geometry capable of engaging associated alignment guides 116.

Data storage device 106 is a representation of a generic data storage device. Many data storage devices have external mounting features 104. The size, shape, and type of external mounting features 104 will vary by make, model and brand of data storage device. Therefore, data storage device carrier 100 is configurable to couple to different types of data storage devices while retaining the features described herein.

Device mating features 130 couple data storage device carrier 100 to data storage device 106 via external mounting features 104. Device mating features 130 can vary in size, shape and type to accommodate different makes, models and brands of data storage devices. In this particular example, device mating features 130 are configured to snap into external mounting features 104 of data storage device 106. However, device mating 130 features can include mechanical fasteners, such as screws or rivets, snap features, adhesives, Velcro® or some other system for mechanically coupling one item to another.

Data storage assembly 108 secures data storage device 106 in a vertical orientation in data storage device 106. Data storage assembly comprises alignment guides 116 and hanging features 118. Data storage assembly 108 is further comprised of electronics, printed circuit boards, fans, fasteners, connectors and other features omitted for clarity.

Alignment guides are configured to engage with retractable alignment features 114 of data storage device carrier 100. Alignment guides 116 may have a tapered shape that permits initial misalignment between retractable alignment features 114 and alignment guides 116 upon insertion of data storage device carrier 100 into data storage assembly 108. Alignment guides correct alignment of data storage device during the insertion of data storage device 106 into data storage assembly 108. Alignment guides 116 may be comprised of many different shapes that can permit an initial amount of misalignment and correct the misalignment as data storage device carrier 100 is inserted into data storage assembly 108.

Hanging features 118 support data storage device carrier 100 and data storage device 106 in a vertical orientation within data storage assembly 108. Hanging features 118 are configure to mate with mounting pins 110. In this particular example, hanging features 118 are shown as having a circular cross-section. Hanging features 118 can have a variety of cross-sectional shapes such as squares, rectangles, or triangles so long as hanging features 118 are capable of mating with mounting pins 110.

Many manufacturing technologies can be employed to manufacture data storage device carrier 100, mounting pins 110, finger grips 112, retractable alignment guides 114, device mating features 130, alignment guides 116, and hanging features 118. Plastics, injection molded plastics in particular, are suitable for manufacturing data storage device carrier 100, mounting pins 110, figure grips 112, retractable alignment guides 114 and device mating features. However, these features can be made from a variety of materials. For example aluminum, steel, composites or other materials capable of providing sufficient structure and physical properties to secure data storage device 106 in a vertical orientation within data storage device assembly 108 can be used.

Data storage assembly 108 may also secure data storage device 106 in a horizontal orientation. Retractable alignment features 114 and alignment guides 116 also function when inserting a data storage device 106 into data storage assembly 108 horizontally. Alignment guides 114 can be configured to interface with data storage device carrier 100 to provide alignment in addition to retractable alignment guides 114.

Figure 2A:
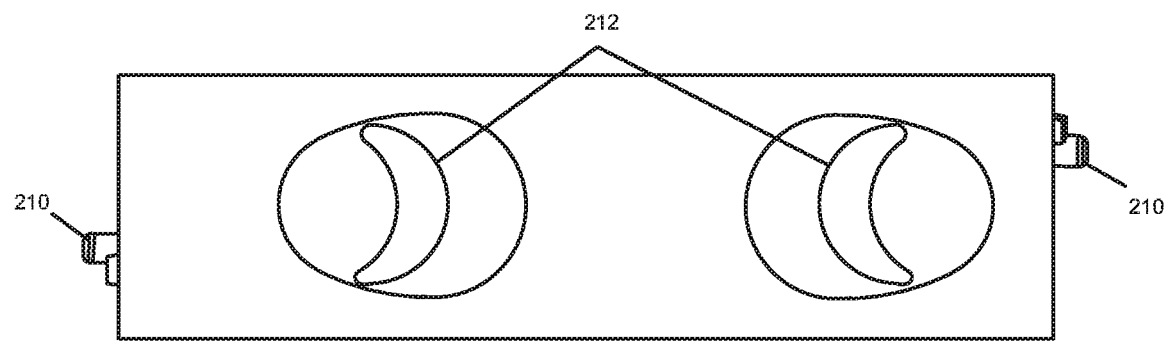
FIGS. 2A and 2B illustrate finger grips, mounting pins and alignment features for a data storage device carrier.
Figure 2B:
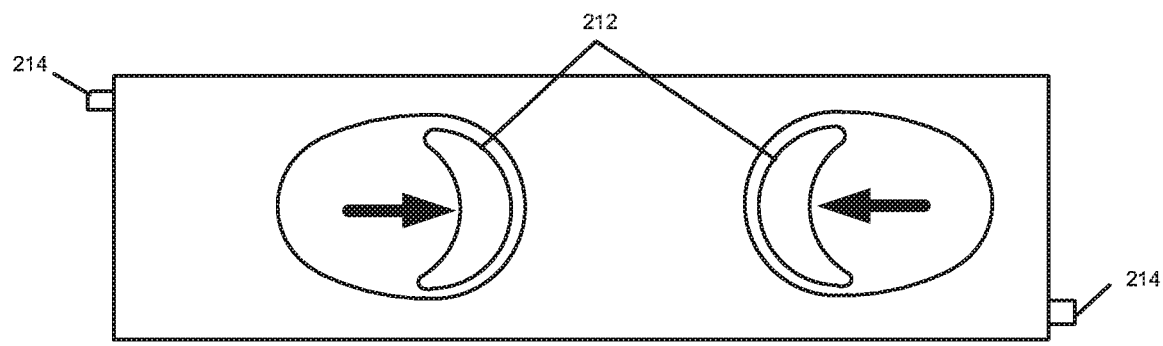

FIGS. 2A and 2B illustrate the operation of data storage device carrier 100 when finger grips 212 are actuated by a user. Finger grips 112 are coupled to mounting pins 210 and retractable alignment features 214 and configured to protrude retractable alignment features 214 concurrent with retracting mounting pins 210. Alternatively, finger grips 112 are configured to at least protrude mounting pins 110 when de-actuated to engage mounting pins 110 in corresponding hanging features 118 of data storage assembly 108 to hang data storage device 106 by data storage device carrier 100 in a vertical orientation.

FIG. 2A illustrates data storage device carrier 200 when finger grips 212 are not actuated by a user. In this state, mounting pins 212 are extended while retractable alignment features 214 are retracted. FIG. 2B illustrates data storage device carrier 200 when finger grips 212 are actuated by a user. The arrows represent the squeezing action of a user actuating finger grips 212. In this state, mounting pins 210 are retracted while retractable alignment features 214 are extended. Many different mechanisms can be assembled to achieve the functionality described herein.

Figure 3A:
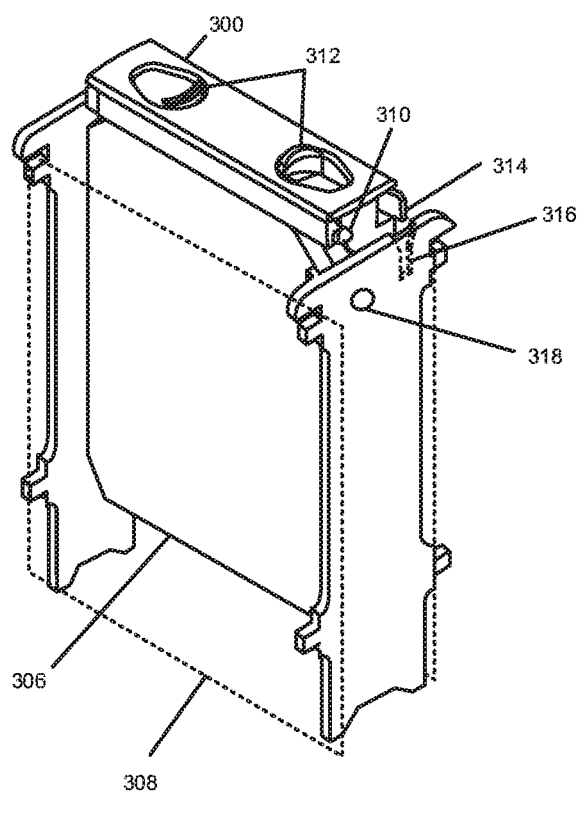
FIGS. 3A and 3B illustrate a carrier for installing and mounting a data storage device into a data storage system.

FIG. 3 illustrates the operation of data storage device carrier 100 coupled to data storage device 306 during insertion into data storage assembly 308. In FIG. 3A, finger grips 312 are shown to be actuated by a user. Finger grips 312 are coupled to mounting pins 310 and retractable alignment features 314. Actuating finger grips 312 protrude retractable alignment features 314 concurrent with retracting mounting pins 310 to provide alignment during insertion of data storage device 306 into data storage assembly 308. Alignment guide 316 is configured to permit initial misalignment between retractable alignment features 314 of data storage device carrier 300 and data storage assembly 308. As data storage device 306 and data storage device carrier 300 are further inserted into data storage assembly 308, alignment guides 316 continue to correct and improve alignment.

Figure 3B:
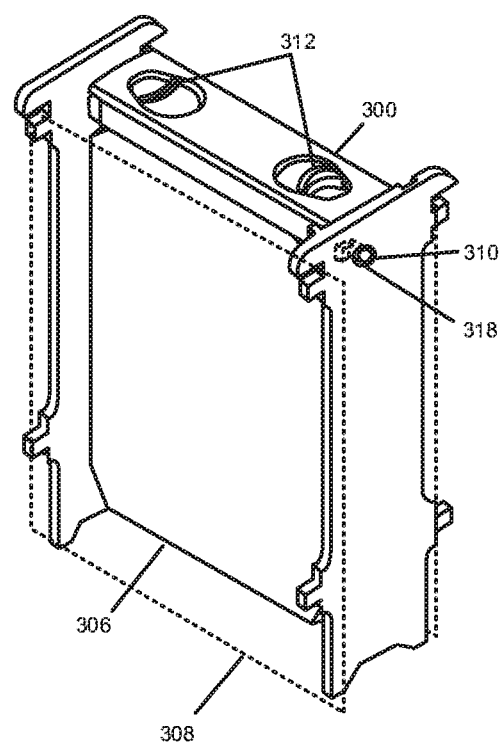

FIG. 3B illustrates data storage device carrier 100 and data storage device 306 installed into data storage assembly 308 in a vertical orientation. In FIG. 3B, finger grips 312 are de-actuated. Finger grips 312 are configured to at least protrude mounting pins 310 when de-actuated to engage mounting pins 310 in corresponding hanging features 318 of data storage assembly 308 to hang data storage device 306 by data storage device carrier 100 in a vertical orientation.

Figure 4:
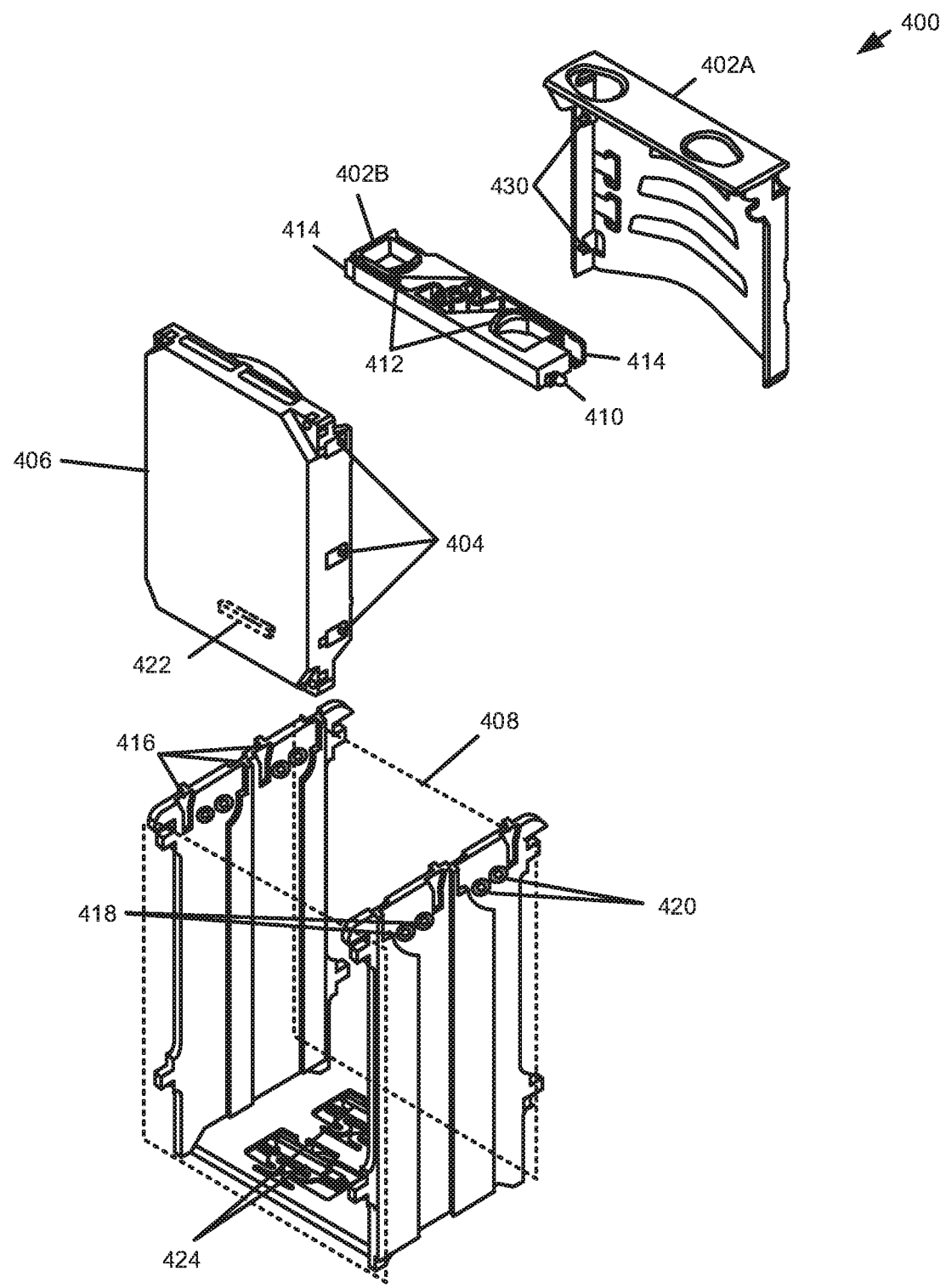
FIG. 4 illustrates a data storage device mounting system.

FIG. 4 illustrates data storage device mounting system 400 for installing and supporting data storage device 406 in a vertical orientation in data storage system 408. Carrier 402 provides an example of data storage device carrier 100, although carrier 402 may have alternative configurations and operations. Likewise, data storage assembly 408 provides an example of data storage assembly 108, although data storage assembly 408 may have alternative configurations and operations. In this example, data storage assembly 408 is capable of supporting more than one data storage device 406.

Data storage device mounting system 400 comprises carrier 402, data storage device 406 and data storage system 408. Carrier 402 is configured to couple to data storage system 406 and hang data storage system 406 in a vertical orientation in data storage assembly 408 from at least two mounting pins 110 coupled to carrier 402. Carrier 402 comprises two articles of manufacture, carrier 402A and carrier 402B. Carrier 402A comprises device mating features 430.

Device mating features 430 couple carrier 402 to data storage device 406. Device mating features 430 can vary in size, shape and type to accommodate different makes, models and brands of data storage devices. In this example, device mating features 430 are configured to snap into external mounting features 404 of data storage device 406. Some data storage devices do not have external mounting features 404. If external mounting features 404 for a particular data storage device 406 do not exist, carrier 402 is configured to couple to external surface features of data storage device 406 to hang data storage device 406 in a vertical orientation in data storage assembly 408 from at least two mounting pins 410 coupled to carrier 402. Device mating features 430 comprise mechanical fasteners, such as screws or rivets, adhesives, Velcro® or some other system for mechanically coupling one item to another.

Carrier 402B comprises mounting pins 410, finger grips 412 and retractable alignment features 414. Carrier 402B integrates mounting pins 410, finger grips 412 and retractable alignment features 414 into a single article of manufacture. Carrier 402A and Carrier 402B couple to form carrier 402.

Carrier 402 has at least two mounting pins 410 configured to mate with associated hanging features 418 of data storage assembly 408 to hang data storage device 406 by carrier 402 in a vertical orientation. Mounting pins 410 are configured to mate with associated hanging features 418 of data storage assembly 408 to have data storage device 406 by carrier 402 in a vertical orientation. Mounting pins 410 can also be configured to engage with viscoelastic grommets 420 of data storage assembly 408 to hang data storage device 406 in data storage assembly 408. In this example, mounting pins 410 have a circular cross-section and the corresponding hanging features 418 and viscoelastic grommets 420 are configured to engage mounting pins 410 having a circular cross-section.

In some examples, viscoelastic grommets 420 are omitted when a very stiff carrier 402 to data storage assembly 408 interface is desired. In addition, mounting pins 410 may be configured with a tapered shape to rigidly mate with similarly configured hanging features 418 to hang data storage device 406 in a vertical orientation within data storage assembly 408. Many different cross-sectional shapes may be used to make mounting pins 410 and hanging features 418, for example shapes such as squares, rectangles, triangles or some other cross-sectional geometry will function to support data storage device 406 in a vertical orientation within data storage assembly 408.

Carrier 402 has one or more finger grips 412 coupled to one or more retractable alignment features 414 and at least two mounting pin 410 configured to extend one or more retractable alignment features 414 beyond carrier 402 concurrent with retracting mounting pins 410 when actuated by a user squeezing one or more finger grips 412 to provide at least alignment during insertion of data storage device 406 into data storage assembly 408. Finger grips 412 are further configured to extend at least two mounting pins 410 concurrent with retracting one or more retractable alignment features 414 when de-actuated by the user. The size and shape of finger grips 412 can vary along with carrier 402 to accommodate a variety of data storage devices 406.

One or more retractable alignment features 414 are coupled to carrier 402 and configured to engage alignment guides 416 to at least provide alignment of data storage device 406 and carrier 402 during insertion of data storage device 406 into data storage assembly 408. Retractable alignment features 414 are further configured to provide alignment of data storage drive 406 in data storage assembly 408 to mate at least one electrical connector 422 of data storage device 406 with at least one associated electrical connector 424 of data storage assembly 408. Retractable alignment features 414 mate with alignment guides 416 wherein the alignment of data storage drive 406 in data storage assembly 408 comprises vertical depth alignment of at least one electrical connector 422 of data storage device 406 and at least one associate electrical connector 424 of data storage assembly 408. The size and shape of retractable alignment features 414 and associated alignment guides 416 can vary along with carrier 402 to accommodate different makes, models and brands of data storage devices. In this particular example, retractable alignment features 414 have a rectangular cross-section. However, the cross-section of retractable alignment features 414 can be square, circular, triangular or some other geometry.

Data storage device 406 is a representation of a generic data storage device. Sizes, shapes, and external mounting features 404 will vary by make, model and brand of data storage device. Therefore, carrier 402 must be configurable to couple to different types of data storage devices while retaining the features described herein. Data storage device 406 comprises external mounting features 404 and electrical connector 422.

Data storage assembly 408 secures data storage device 406 in a vertical orientation and provides electrical communication to data storage device 406. Data storage assembly comprises alignment guides 416, hanging features 418, viscoelastic grommets 420, and electrical connections 424.

Alignment guides 416 are configured to engage retractable alignment features 414 of carrier 402. Alignment guides 416 have a funnel-like shape that permits initial misalignment between retractable alignment features 414 and alignment guides 416 upon insertion of carrier 402 into data storage assembly 408. Retractable alignment features 414 mate with alignment guides 416 to align data storage drive 406 in data storage assembly 408 such that vertical depth alignment of at least one electrical connector 422 of data storage device 406 and at least one associate electrical connector 424 of data storage assembly 408. The size and shape of retractable alignment features 414 and associated alignment guides 416 can vary along with carrier 402 to accommodate different makes, models and brands of data storage devices. Alignment guides 416 may be comprised of many different shapes so long as they permit an initial amount of misalignment, provide alignment of data storage device 406 in data storage assembly 408 to mate at least one electrical connector 422 of data storage device 406 with at least one associated electrical connectors 424 of data storage assembly 428, and provides vertical depth alignment of data storage device 406 with respect to electrical connector 424.

Hanging features 418 support carrier 402 and data storage device 406 in a vertical orientation within data storage assembly 408. In this example, hanging features are configured to retain viscoelastic grommets 420. Viscoelastic grommets 420 are configured to mate with mounting pins 410. In this particular example, hanging features 418 and viscoelastic grommets 420 are shown having a circular cross-section. Hanging features 418 and viscoelastic grommets 420 can have a variety of cross-sectional shapes such as squares, rectangles, or triangles so long as hanging features 418 and viscoelastic grommets 420 are capable of mating with mounting pins 410. Viscoelastic grommets 420 may be made from materials such as Sorbothane®, Implus®, Noene® or some other commercially available viscoelastic materials. Viscoelastic grommets 420 may also be made from plastics, rubbers, silicones or other vibration damping materials.

In this example, data storage assembly 408 has two electrical connectors 424 to couple with two data storage devices 406 in one data storage assembly 408. Electrical connector 424 of data storage assembly 408 mates with electrical connector 422 of data storage device 406 to provide communication between data storage device 406 and data storage assembly 408. Electrical connectors 424 of data storage assembly 408 are mounted on a printed circuit board that has cut-away islands for mounting electrical connectors 424. Mounting electrical connectors 424 to these islands help mitigate vibration transfer between data storage device 406 and data storage assembly 408. Also, electrical connector 424 is configured to bear some of the weight and support data storage device 406 and carrier 402 along with viscoelastic grommets 420 in a vertical orientation within data storage assembly 408.

Data storage assembly 408 is further comprised of many materials and features that are beyond the scope of this application. A typical data storage assembly will be comprised of metals, plastics, aluminum, printed circuit boards and other materials.

Many manufacturing technologies currently exist to suitably manufacture carrier 402, mounting pins 410, finger grips 412, retractable alignment guides 414, device mating features 430, alignment guides 416, and hanging features 418. Plastics, injection molded plastics in particular, are suitable for manufacturing carrier 402, mounting pins 410, figure grips 412, retractable alignment guides 414 and device mating features 430. However, these features can be made from a variety of materials. For example aluminum, steel, composites or other materials capable of providing sufficient structure and physical properties to secure data storage device 406 in a vertical orientation within data storage device assembly 408 can be used.

Figure 5A:
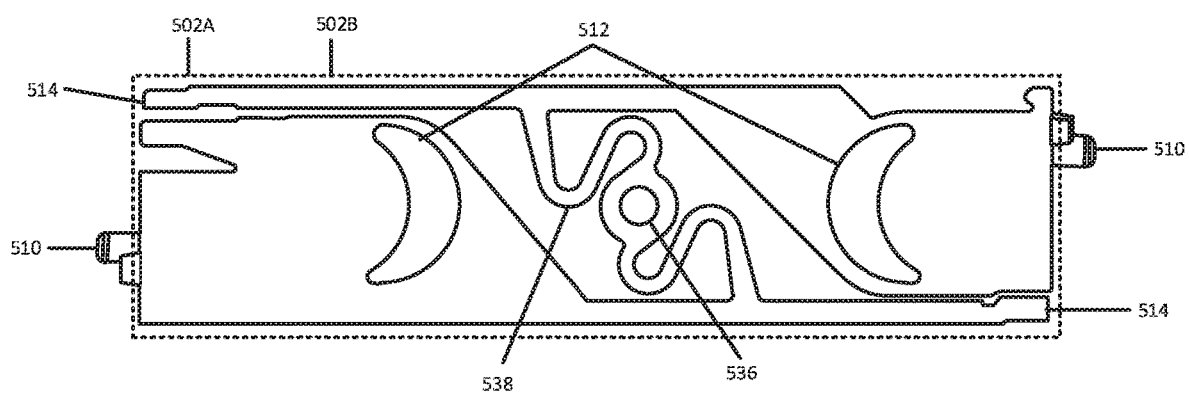
FIGS. 5A and 5B illustrate finger grips, mounting pins and alignment features for a data storage device carrier.
Figure 5B:
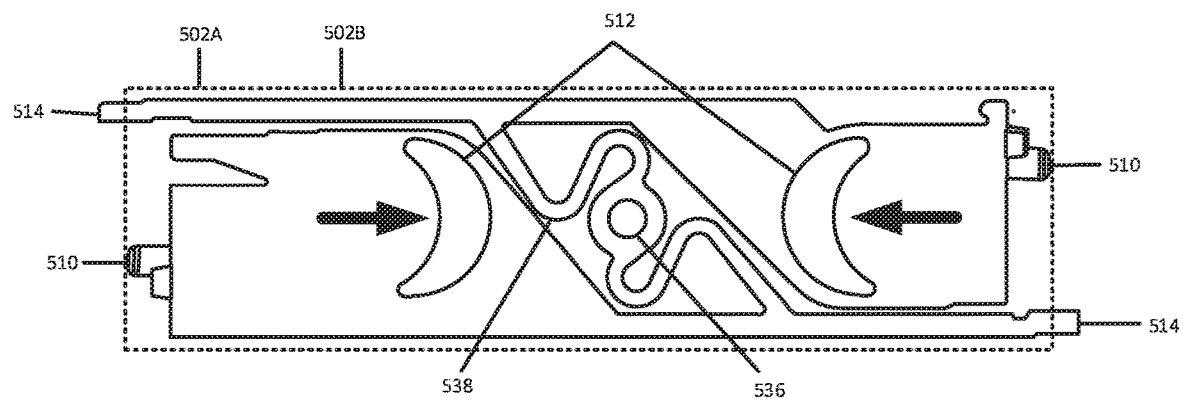

FIGS. 5A and 5B illustrate the operation of carrier 402. One or more finger grips 512 are coupled to one or more retractable alignment features 514 and at least two mounting pins 510 and configured to extend one or more retractable alignment features 514 beyond carrier 502A concurrent with retracting mounting pins 510 when actuated by a user squeezing one or more finger grips 512 to provide at least alignment during insertion of data storage device 406 into data storage assembly 408. Alternatively, one or more finger grips 512 are configured to extend at least two mounting pins 510 concurrent with retracting one or more retractable alignment features 514 when de-actuated by the user.

FIG. 5A illustrates carrier 502 when finger grips 512 are de-actuated. In this state, mounting pins 510 are extended while retractable alignment features 514 are retracted. FIG. 5B illustrates carrier 502 when finger grips 512 are actuated. The arrows represent the squeezing action of a user actuating finger grips 512. In this state, mounting pins 510 are retracted while retractable alignment features 514 are extended.

FIG. 5B illustrates carrier 502 when finger grips 512 are actuated. The squeezing action of the user actuating finger grips 512 is represented by the arrows. In this state finger grips 512 are moved closer together. Mounting hole 536 and carrier 502A linearly guide mounting pins 510 and retractable alignment features 514. In this state, mounting pins 510 are retracted and retractable alignment features 514 are extended.

Figure 6A:
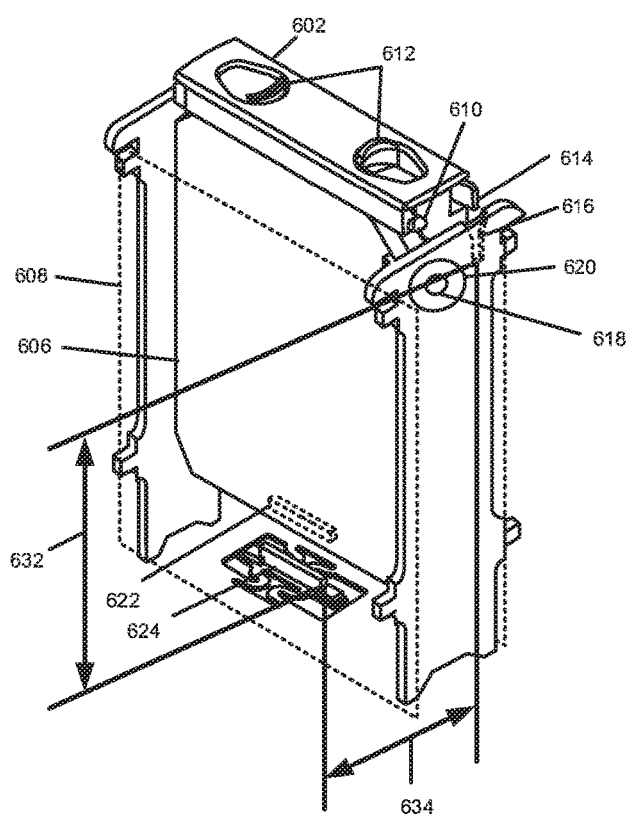
FIGS. 6A and 6B illustrate alignment and mounting features for a data storage device mounting system.
Figure 6B:
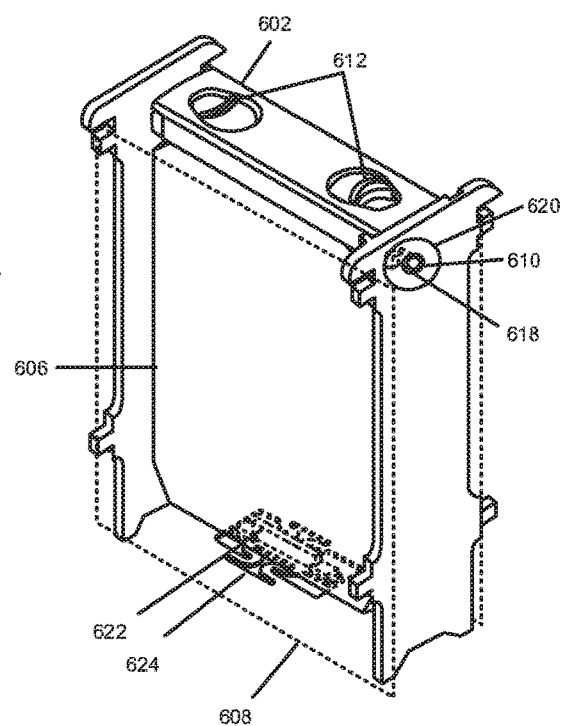

FIGS. 5A and 5B also illustrate how mounting pins 510, finger grips 512 and retractable alignment features can comprise a single article of manufacture. In this particular example, mounting hole 536 provides a pivot point for hanging pins 510, finger grips 512 and retractable alignment features 514. FIG. 5A illustrates carrier 502 in its nominal state, that is, finger grips 112 de-actuated. Finger grips 512 are at their furthest distance apart in this state. Also, mounting pins 510 are extended and retractable alignment features 514 are retracted. The geometry of carrier 502 includes spring system 538. Spring system 538 and mounting hole 536 work together to maintain the nominal state shown in FIG. 5A FIGS. 6A and 6B illustrate insertion of carrier 602 and data storage device 606 into data storage assembly 608. One or more retractable alignment features 614 are configured to provide alignment 634 of data storage device 606 in data storage assembly 608 to mate at least one electrical connector 622 of data storage device 606 with at least one associated electrical connector 524 of data storage assembly 608 as represented by arrow 634. Additionally, one or more retractable alignment features 614 engage alignment guides 616 such that alignment of data storage device 606 in data storage assembly 608 comprises vertical depth alignment 632 of at least one electrical connector 622 of data storage device 606 with at least one associated electrical connector 624 of data storage assembly 608 as represented by arrow 632.

FIG. 6A illustrates finger grips 612 actuated during insertion of data storage device 606 into data storage assembly 608 so that retractable alignment features 616 are extended to provide alignment of data storage device 606 in data storage assembly 608. Finger grips 612 actuated by a user cause mounting pins 610 to retract and retractable alignment features 614 to extend.

FIG. 6B illustrates carrier 602 and data storage device 606 installed into data storage assembly 608. The user de-actuates finger grips 612 once data storage device 606 is installed. In this state, retractable alignment features 614 retract concurrent with the extension of mounting pins 610. Mounting pins 610 engage viscoelastic grommets 620 of hanging features 618 of data storage assembly 608 to support data storage device 606 by carrier 602 in a vertical orientation. In this example, at least one associate electrical connector 624 of data storage assembly 608 is installed on a floating printed circuit board island allowing at least one electrical connector 624 of data storage assembly 608 to support a portion of the weight of data storage device 608 along with viscoelastic grommet 620. This configuration helps mitigate vibration transfer between data storage device 606 and data storage assembly 608.

Figure 7:
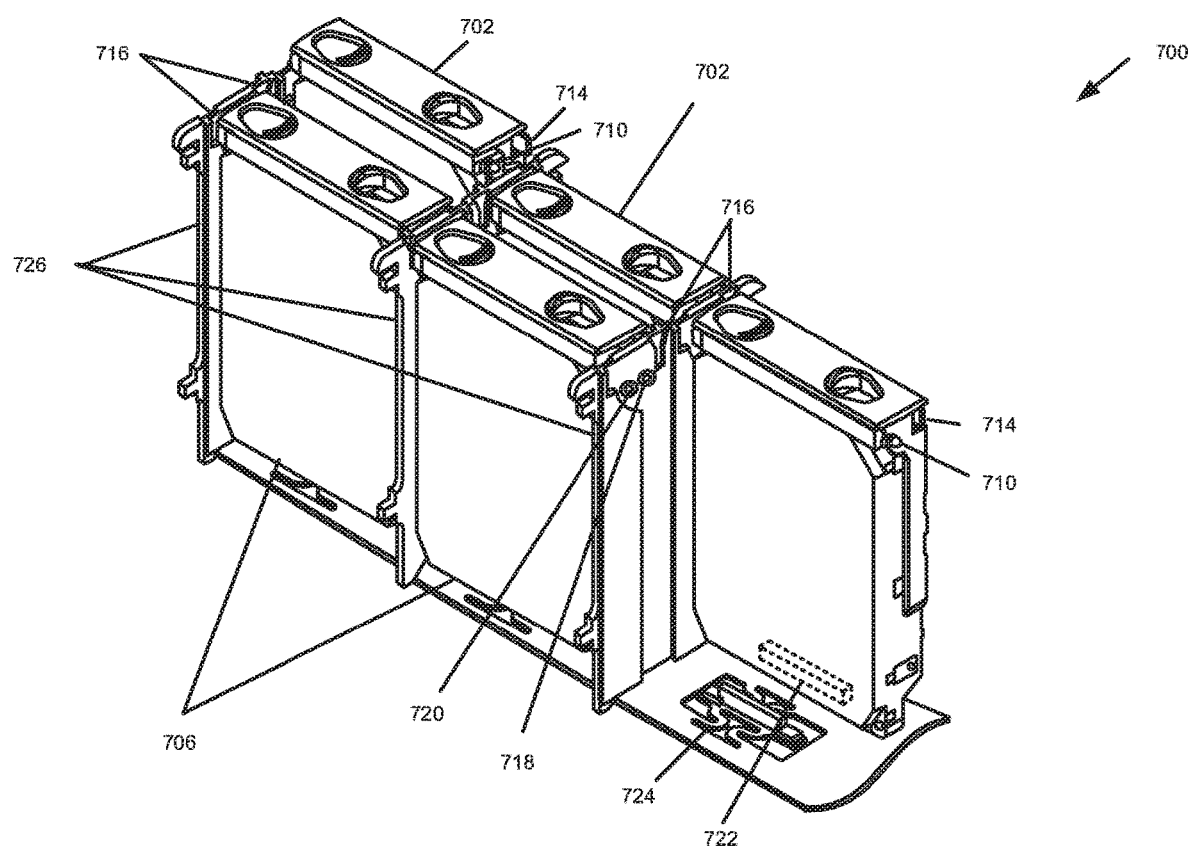
FIG. 7 illustrates a data storage assembly for holding an array of data storage devices.

FIG. 7 illustrates data storage assembly for holding an array of data storage devices 700. Data storage assembly for holding an array of data storage devices 700 comprises a plurality of carriers 702, data storage devices 706, electrical connectors 722, electrical connectors 724, a plurality of drive dividers 726 and an enclosure.

Carriers 702 are examples of data storage device carrier 100 and carrier 402, although carriers 702 may have alternative configurations and operations. Carriers 702 comprise retractable hanging pins 710, finger grips 712, and retractable alignment projections 714. Carriers 702 are configured to couple to associated data storage devices 706, each of the plurality of carriers 702 comprising retractable alignment projections 714 that extend during insertion of the associated data storage drives 706 into data storage assembly for holding an array of data storage devices 700 and retractable hanging pins 710 that retract during insertion of the associated data storage devices 706 into data storage assembly for holding an array of data storage devices 700.

Carriers 702 have retractable hanging pins 710 that retract during insertion of data storage drives 706 into data storage assembly for holding an array of data storage devices 700. Retractable hanging pins 710 are examples of mounting pins 110 and mounting pins 410, although retractable hanging pins 710 may have alternative configurations and operations. Retractable hanging pins 710 are configured to interface with a plurality of drive dividers 726.

Carriers 702 have finger grips 712 configured to extend the retractable hanging pins 710 concurrent with retracting retractable alignment projections 714 when de-actuated by a user. Finger grips 712 are examples of finger grips 112 and finger grips 414, although finger grips 712 may have alternative configuration and operations. Finger grips 712 are coupled to one or more retractable alignment projections 714 and retractable hanging pins 710 configured to extend one or more retractable alignment projections 714 beyond carriers 702 concurrent with retracting retractable hanging pins 710 when actuated by a user squeezing one or more finger grips 712 to provide at least alignment during insertion of data storage devices 706 into data storage assembly for holding an array of data storage devices 700.

Retractable alignment projections 714 are examples of retractable alignment features 114 and retractable alignment features 414, although retractable alignment projections may have alternative configurations and operations. Retractable alignment projections 714 are configured to prevent insertion of data storage drives 706 into data storage assembly for holding an array of data storage devices 700 beyond a predetermined depth and align electrical connectors 722 of the associated data storage devices 706 with electrical connectors 724 of data storage assembly for holding an array of data storage devices 700.

Data storage devices 706 are examples of data storage device 106 and data storage device 406, although data storage device 706 may have alternative configurations and operations. Data storage devices 706, as illustrated, are representations of generic data storage devices. Sizes, shapes, and external mounting features will vary by make, model and brand of data storage device. Therefore, carriers 702 are configurable to couple to different types of data storage devices while retaining the features described herein. Data storage devices have at least one electrical connector 722.

Data storage assembly for holding an array of data storage devices 700 comprises at least one electrical connector 724 to interface with at least one associated electrical connector 722 of data storage devices 706. Electrical connectors 724 are mounted on a printed circuit board having cut-outs to form islands for electrical connectors 724 to mount to. These islands cut into the printed circuit board help mitigate vibration transfer between data storage device 706 and data storage assembly 700.

A plurality of drive dividers 726 comprising alignment guides 716 are configured to assist alignment of the plurality of carriers 702 upon insertion into data storage assembly for holding an array of data storage devices 700 by at least interfacing with retractable alignment projections 714 to position carriers 706 with respect to electrical connectors 722 for data storage devices 726 and electrical connectors 724 for data storage assembly for holding an array of data storage devices 700. The plurality of drive dividers 726 are further configured to interface with retractable hanging pins 710 to hang the data storage devices 706 from an associated from carriers 702.

Data storage assembly for holding an array of data storage devices 700 includes an enclosure configured to provide structural support to data storage assembly for holding an array of data storage devices 700. Enclosures for holding an array of data storage devices are known. For the sake of brevity and clarity illustrations of enclosures have been omitted.

Figure 8:
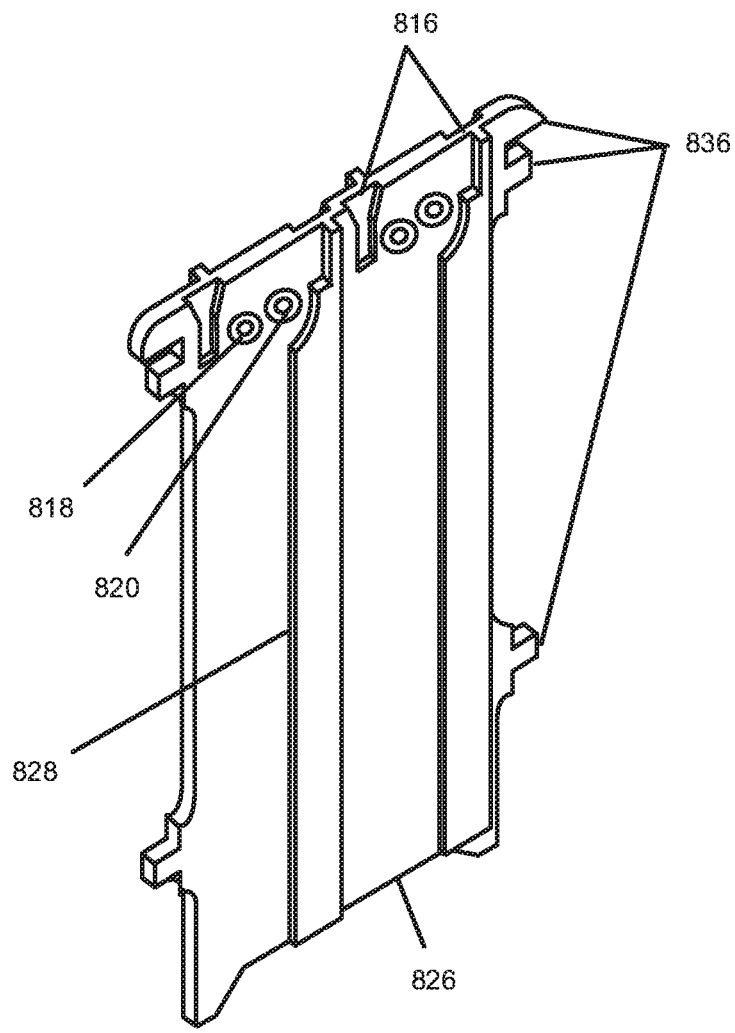
FIG. 8 illustrates a drive divider for a data storage assembly for holding an array of data storage devices.

FIG. 8 illustrates drive divider 826 comprising alignment guides 816, hanging features 118, viscoelastic grommets 820, optional alignment features 828 and assembly features 836. Drive divider 826 may have alignment guides 816, hanging features 118, viscoelastic grommets 820 and optional alignment features 828 on both sides to increase the number of data storage devices 706 that one drive divider can support. Alignment guides 816 are configured to assist alignment of the plurality of carriers 702 upon insertion into data storage assembly for holding an array of data storage devices 700 by at least interfacing with retractable alignment projections 714 to position carriers 702 with respect to electrical connectors 722 and electrical connectors 724. Alignment guides 816 are further configured to provide vertical depth alignment of data storage devices 706 with respect to electrical connectors 722 and electrical connectors 724. Drive dividers 800 interface with retractable hanging pins 710 to hang data storage devices 706 from associated carriers 702. Hanging feature 818 are configured to retain a viscoelastic grommets 820 that are configured to engage retractable hanging pins 810 to hang data storage devices 706 in data storage assembly for holding an array of data storage devices 700. Optional alignment features 828 engage carriers 702 in various places to assist insertion of data storage devices 706 into data storage assembly for holding an array of data storage devices 700. Assembly features 836 are optional. Assembly features 836 are used to secure the drive dividers with an enclosure and to aid in the assembly of data storage assembly for holding an array of data storage devices 700. Assembly features 836 can vary in size, shape and number from what is illustrated in FIG. 800. In this example, drive dividers 826 are made of plastic. However, these drive dividers can be made from a variety of materials. For example aluminum, steel, composites or other materials capable of providing sufficient structure and physical properties can be used.

Many manufacturing technologies currently exist to suitably manufacture carriers 702, retractable hanging pins 710, finger grips 712 and retractable alignment projections 714. Plastics, injection molded plastics in particular, are suitable for manufacturing carriers 702, retractable hanging pins 710, figure grips 712, retractable alignment projections 714. However, these features can be made from a variety of materials. For example aluminum, steel, composites or other materials capable of providing sufficient structure and physical properties can be used.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A data storage device carrier, comprising:
   device mating features structurally configured to couple to external mounting features of a data storage device;
   mounting pins configured for hanging the data storage device in a data storage assembly; and
   finger grips coupled to the mounting pins and to alignment features via a spring system;
   wherein:
   responsive to actuation of the finger grips linearly moving the finger grips closer together and extending the spring system, the alignment features coupled to the finger grips via the spring system moving to an extended position to prevent insertion of the data storage device carrier beyond a predetermined depth with respect to the data storage assembly concurrent with the mounting pins coupled to the finger grips via the spring system moving to a retracted position; and
   responsive to de-actuation of the finger grips returning the spring system to a nominal state, the mounting pins coupled to the finger grips via the spring system moving to an extended position to engage the mounting pins into corresponding features of the data storage assembly that hang the data storage device in the data storage assembly.

2. The data storage device carrier of claim 1, wherein:
   the alignment features are configured to protrude concurrent with retraction of the mounting pins; and
   the mounting pins are configured to protrude concurrent with retraction of the alignment features.

3. The data storage device carrier of claim 1, wherein the finger grips are actuated by squeezing the finger grips.

4. The data storage device carrier of claim 1, wherein the mounting pins are configured to engage with viscoelastic grommets of the features that hang the data storage device in the data storage assembly.

5. The data storage device carrier of claim 1, wherein the alignment features are configured to provide alignment of the data storage device in the data storage assembly to mate at least one electrical connector of the data storage device with at least one associated electrical connector of the data storage assembly.

6. The data storage device carrier of claim 5, wherein the alignment of the data storage device in the data storage assembly comprises depth alignment between the at least one electrical connector of the data storage device and the at least one associated electrical connector of the data storage assembly.

7. The data storage device carrier of claim 6, wherein the alignment features, the mounting pins, and the finger grips are integrated into a single article of manufacture.

8. A data storage device mounting system, comprising:
   an assembly comprising finger grips, a spring system, insertion alignment features coupled to the finger grips via the spring system, and mounting pins coupled to the finger grips via the spring system, the assembly configured to move the insertion alignment features to an extended position and move the mounting pins to a retracted position responsive to linear actuation of the finger grips extending the spring system and move the mounting pins to an extended position responsive to de-actuation of the finger grips returning the spring system to a nominal state; and
   a carrier coupled to a data storage device and to the assembly, and configured to hang the data storage device from the mounting pins after insertion of the carrier into a data storage enclosure aided by the insertion alignment features.

9. The data storage device mounting system of claim 8, wherein the assembly is further configured to:
   extend the mounting pins concurrent with retracting the insertion alignment features; and
   extend the insertion alignment features concurrent with retracting the mounting pins.

10. The data storage device mounting system of claim 8, wherein the carrier is further configured to:
    couple to external surface features of the data storage device; and
    support the data storage device when the carrier is hung by the mounting pins.

11. The data storage device mounting system of claim 8, wherein the mounting pins are configured to engage with one or more viscoelastic grommets of the data storage enclosure to hang the data storage device in the data storage enclosure.

12. The data storage device mounting system of claim 8, wherein the insertion alignment features are further configured to provide alignment of the data storage device in the data storage enclosure to mate at least one electrical connector of the data storage device with at least one associated electrical connector of the data storage enclosure.

13. The data storage device mounting system of claim 12, wherein the alignment of the data storage device in the data storage enclosure comprises vertical depth alignment of the at least one electrical connector of the data storage device with the at least one associated electrical connector of the data storage enclosure.

14. The data storage device mounting system of claim 13, wherein the insertion alignment features, the mounting pins, and the finger grips are integrated into a single article of manufacture comprising the assembly.

15. An apparatus, comprising:
    means for coupling to mating features of a storage drive and supporting the storage drive in a vertical orientation in a storage enclosure;
    means for aligning insertion of the means for coupling into the storage enclosure responsive to finger grips coupled to the means for aligning being actuated and for vertically hanging the means for coupling in the storage enclosure responsive to the finger grips being de-actuated.

16. The apparatus of claim 15, wherein the means for aligning is configured to:
    extend mounting pins concurrent with retracting insertion alignment features; and
    extend the insertion alignment features concurrent with retracting the mounting pins.

17. The apparatus of claim 16, wherein the mounting pins are configured to engage with one or more viscoelastic grommets of the storage enclosure to hang the storage device in the storage enclosure.

18. The apparatus of claim 15, wherein the means for aligning further provides for alignment of the storage device in the storage enclosure to mate at least one connector of the storage device with at least one mating connector of the storage enclosure.

19. The apparatus of claim 18, wherein the alignment of the storage device in the storage enclosure comprises vertical depth alignment of the at least one connector of the storage device with the at least one mating electrical connector of the storage enclosure.

20. The apparatus of claim 15, wherein the means for aligning comprises a single article of manufacture that includes insertion alignment features for aligning insertion of the means for coupling, mounting pins for hanging the means for coupling in the storage enclosure, the finger grips, and spring means for coupling together the insertion alignment features and the mounting pins with the finger grips.

* * * * *